(12) United States Patent
Lin (10) Patent No.: US 10,072,830 B2
(45) Date of Patent: Sep. 11, 2018

(54) UNIFORM LUMINANCE LIGHT-EMITTING DIODE CIRCUIT BOARD

(71) Applicant: Hung Lin, Keelung (TW)

(72) Inventor: Hung Lin, Keelung (TW)

( * ) Notice: Subject to any disclaimer, the term of this patent is extended or adjusted under 35 U.S.C. 154(b) by 77 days.

(21) Appl. No.: 15/148,236

(22) Filed: May 6, 2016

(65) Prior Publication Data
US 2017/0321872 A1 Nov. 9, 2017

(51) Int. Cl.
| | | |
|---|---|---|
| *F21V 1/00* | (2006.01) | |
| *F21V 23/00* | (2015.01) | |
| *F21V 23/02* | (2006.01) | |
| *H05K 1/02* | (2006.01) | |
| *H05K 1/18* | (2006.01) | |
| *F21Y 103/00* | (2016.01) | |
| *F21Y 105/00* | (2016.01) | |

(52) U.S. Cl.
CPC .......... *F21V 23/001* (2013.01); *F21V 23/005* (2013.01); *F21V 23/02* (2013.01); *H05K 1/0296* (2013.01); *H05K 1/181* (2013.01); *F21Y 2103/003* (2013.01); *F21Y 2105/001* (2013.01); *H05K 2201/10106* (2013.01)

(58) Field of Classification Search
CPC ............. F21Y 2101/00; F21Y 2101/10; F21Y 2115/00; F21Y 2115/10; F21K 9/00; F21K 9/20

USPC ........................ 362/249.06, 249.11, 612, 630
See application file for complete search history.

(56) References Cited

U.S. PATENT DOCUMENTS

| | | | | |
|---|---|---|---|---|
| 8,324,837 | B2 * | 12/2012 | Lin ................... | H05B 33/0827 315/294 |
| 2007/0115685 | A1 * | 5/2007 | Kondo ................. | G09G 3/3426 362/561 |
| 2008/0062714 | A1 * | 3/2008 | Kim .................. | G02F 1/133603 362/609 |
| 2012/0096423 | A1 * | 4/2012 | Chang ................ | H05B 33/0806 716/133 |

\* cited by examiner

*Primary Examiner* — Daniel St Cyr
(74) *Attorney, Agent, or Firm* — patenttm.us (57) ABSTRACT

A uniform luminance light-emitting diode (LED) circuit board includes a first primary trace and a second primary trace mounted on a substrate along a direction and are spaced apart, multiple LED strings mounted on the substrate along the direction and parallelly connected between the first primary trace and the second primary trace, a first power trace and a second power trace respectively connected to the first primary trace and the second primary trace, and a first auxiliary trace with two ends respectively connected to the second primary trace and the second power trace. By adjusting trace widths of the first primary trace and the second primary trace to limit current passing through each LED string and using the first auxiliary trace to provide an additional current path, identical current flowing through all the LED strings results in uniform luminance of the LED strings.

16 Claims, 8 Drawing Sheets

UNIFORM LUMINANCE LIGHT-EMITTING DIODE CIRCUIT BOARD

BACKGROUND OF THE INVENTION

1. Field of the Invention

The present invention relates to a circuit board and, more particularly, to a light-emitting diode (LED) circuit board capable of generating uniform luminance.

2. Description of the Related Art

Conventionally, when LEDs are applied to lighting and backlight applications, the LEDs are usually mounted on a substrate. All traces on the substrate take the form of a single trace layout. Luminance of each LED is determined by current flowing through the LED. The most common way of connecting the LEDs is done by either series connection or parallel connection. However, in the event of the series-connected LEDs, driving voltage increases with the number of the LEDs. When the driving voltage is insufficient to drive the LEDs, additional voltage-boosting circuit or LED power driver is required to provide higher voltage to normally drive the series-connected LEDs and certainly increases the production cost.

Figure 5A:
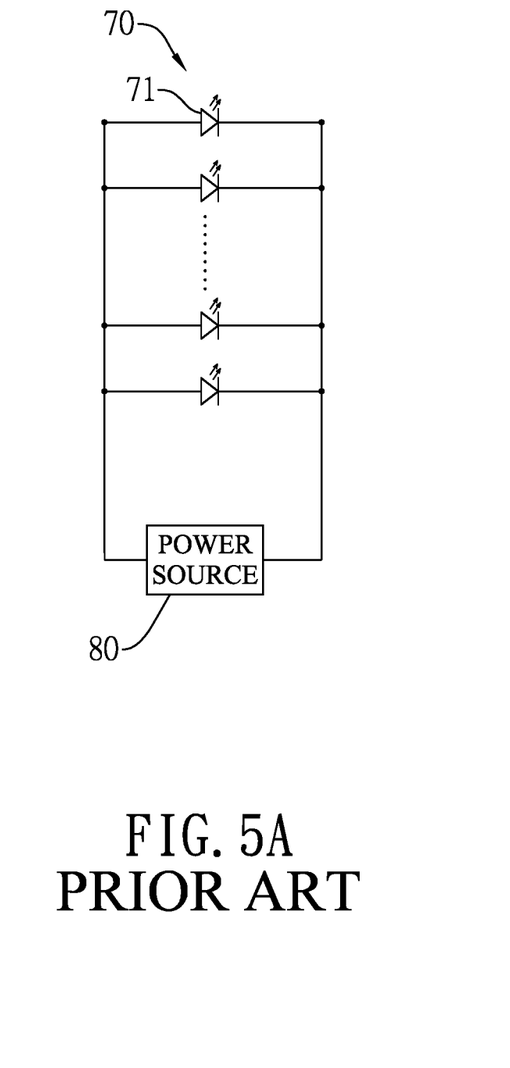
FIG. 5A is a circuit diagram of a conventional parallel-connected LED circuit.

With reference to FIG. 5A, after being connected in parallel, multiple LED strings 70 are connected to a power source 80. Thus, all the LED strings receive a same voltage, which is the same as voltage supplied by the power source 80. For example, each LED string 70 includes an LED 71 receiving power with a voltage value identical to that provided by the power source. As traces connecting the LEDs 71 and the power source 80 have their resistance values, the voltage received by each LED 71 depends upon a trace length between the LED 71 and the power source 80. The longer the trace length between the LED 71 and the power source 80, the more the resistance value of a circuit loop formed by traces between the LED and the power source. Although the power source 80 supplies power with a constant voltage value, current flowing through different LEDs 71 and varying with the circuit loops between the respective LEDs 71 and the power source 80 causes different or inconsistent luminance of the LEDs 71.

Figure 5B:
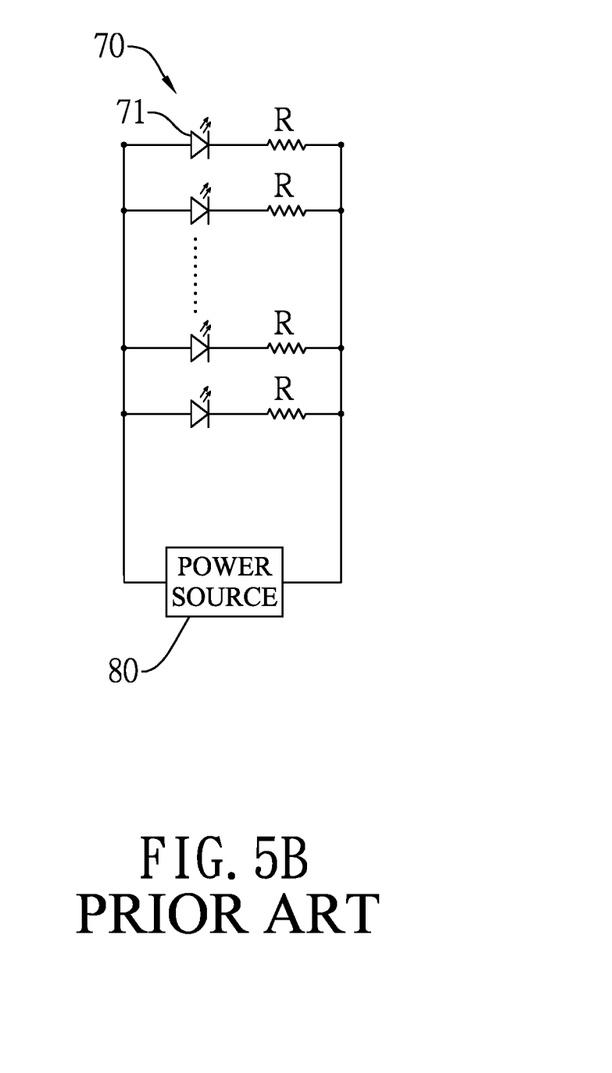
FIG. 5B is circuit diagram of the enhanced conventional parallel-connected LED circuit in FIG. 5A.

With reference to FIG. 5B, each LED string 70 further includes a resistor R. For example, each LED string 70 has a resistor R connected to an LED 71 in series. The resistance value of the circuit loop between each LED string and the power source 80 can be adjusted by the resistor R to lower the difference in resistance values of the circuit loops between the respective LED strings 70 and the power source 80 and suppress current flowing through each LED 71. However, more current loss arises from the use of the resistor R in such an approach. Hence, voltage of the power source 80 needs to be boosted to increase voltage of each LED string 70, such that same current flowing through the LEDs 71 can be maintained. As each LED string 70 requires a series-connected resistor R, a total number of the resistors R increases with the number of the LED strings 70 to cause manufacturing cost increase. Additionally, the power utilization efficiency is dropped because voltage-boosting operation performed on the resistors R.

Figure 6A:
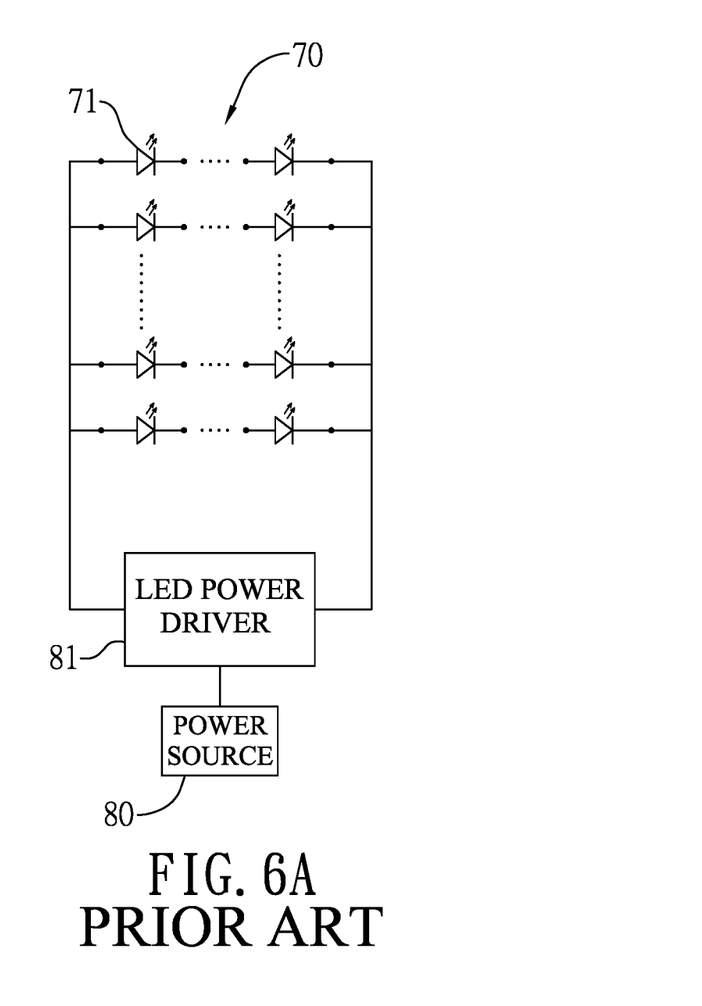
FIG. 6A is a circuit diagram of another conventional parallel-connected LED circuit.

With reference to FIG. 6A, each LED string 70 includes multiple LEDs connected in series. The power source 80 is further connected to an LED power driver 81. The LED power driver 81 boosts voltage of the power source 80 and supplies constant current to each LED string 70. Although the LED power driver 81 can supply constant current to each LED string 70, the resistance value of each circuit loop between each LED string 70 and the power source 80 is still determined by a trace length of the circuit loop. Similarly, the issue of inconsistent luminance among different LED strings 70 also happens because of different current values through the LED strings 70 as a result of differences of the resistance values of different circuit loops.

Figure 6B:
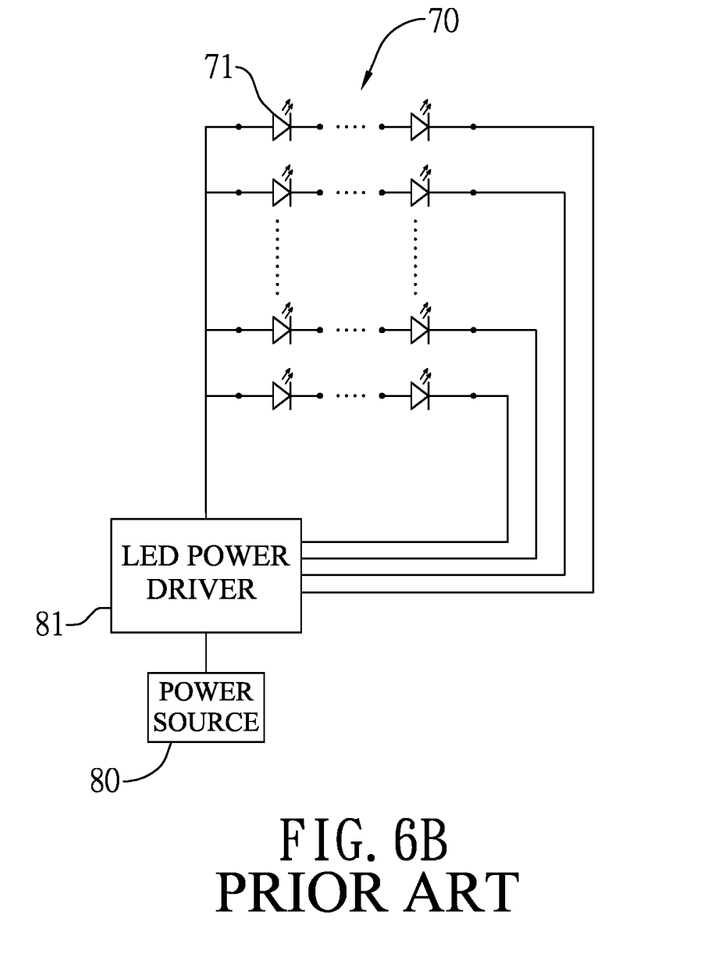
FIG. 6B is a circuit diagram of the enhanced conventional parallel-connected LED circuit in FIG. 6A.

With reference to FIG. 6B, another LED power driver 81 is employed. The LED power driver 81 includes multiple channels electrically connected to multiple LED strings 70 respectively. By using the LED power driver 81 to adjust current flowing through each LED string 70, identical current values across the LED strings 70 can be ensured to tackle the issue of inconsistent luminance arising from different current values across the LED strings 70. As the LED power driver 81 needs to receive information about current flowing through each LED string 70 for adjustment of current flowing through the LED string 70, when the LED strings 70 increases in number, the LED power driver 81 requires more channels in connection with the LED strings 70 and a demand for a more high-end and expensive LED power driver 81 becomes necessary and inevitably increases the overall cost.

Moreover, a conventional parallel circuit for tablet with enhanced power utilization efficiency includes a first constant voltage layer and a second constant voltage layer formed on a top surface and a bottom surface of a substrate respectively. The first and second constant voltage layers are connected to a power supply respectively through two power connection points. The first constant voltage layer has at least one insulating zone. Each insulating zone has a light-emitting unit formed therein. One electrode of the light-emitting unit is connected to the first constant voltage layer, and the other electrode thereof is connected to the second constant voltage layer through a conducting trace. When the power supply outputs a low voltage to the first constant voltage layer, resistance values everywhere on the first constant voltage layer are identical. However, due to the conducting trace required by the light-emitting unit to electrically connect to the second constant voltage layer through an opening formed through the first substrate, the production process and composition of the parallel circuit are complicated. Besides, the first constant voltage layer and the second constant voltage layer are fully spread over the circuit board to result in a higher material cost. Meanwhile, the first constant voltage layer and the second constant voltage demand for larger areas and in turn consume more power.

SUMMARY OF THE INVENTION

An objective of the present invention is to provide a uniform luminance light-emitting diode (LED) circuit board eliminating an additional resistor for each LED string to limit current flowing through the LEDs and a compensation module for boosting voltage of the LEDs with lower luminance.

To achieve the foregoing objective, the uniform luminance LED circuit board includes a substrate, a first primary trace, a second primary trace, multiple LED strings, a first power trace, a second power trace and an auxiliary trace.

The first primary trace is mounted on the substrate.

The second primary trace is mounted on the substrate and is spaced apart from the first primary trace.

The multiple LED strings are sequentially mounted on the substrate with two ends of each LED string electrically connected to the first primary trace and the second primary trace respectively and parallelly connected between the first primary trace and the second primary trace.

The first power trace is mounted on the substrate and is electrically connected to the first primary trace.

The second power trace is mounted on the substrate and is electrically connected to the second primary trace.

The first auxiliary trace is mounted on the substrate with two ends of the first auxiliary trace electrically connected to the second primary trace and the second power trace respectively.

Trace widths of the first primary trace and the second primary trace are wider than those of the first power trace, the second power trace and the first auxiliary trace.

Given the foregoing uniform luminance LED circuit board, the first primary trace and the second primary trace serve to limit current flowing through each LED string and eliminate the need of additional series-connected resistors for the LED strings to achieve cost reduction and structural simplification, and the first auxiliary trace serves to provide an additional current path to reduce trace resistance and adjust current flowing through each LED string to be the same. Accordingly, current flowing through the LED strings is adjustable at the absence of a current compensation module for boosting voltage of the LED strings, and the LED strings emit light with identical lighting intensity or uniform luminance.

Other objectives, advantages and novel features of the invention will become more apparent from the following detailed description when taken in conjunction with the accompanying drawings.

DETAILED DESCRIPTION OF THE INVENTION

Figure 1:
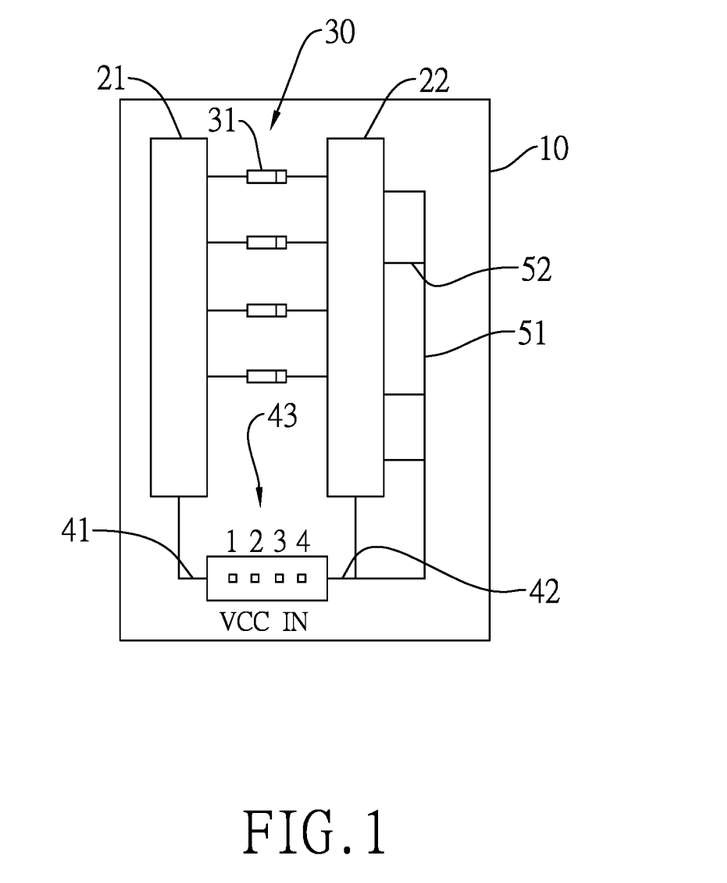
FIG. 1 is a schematic block diagram of a first embodiment of a uniform luminance LED circuit board in accordance with the present invention.
Figure 2:
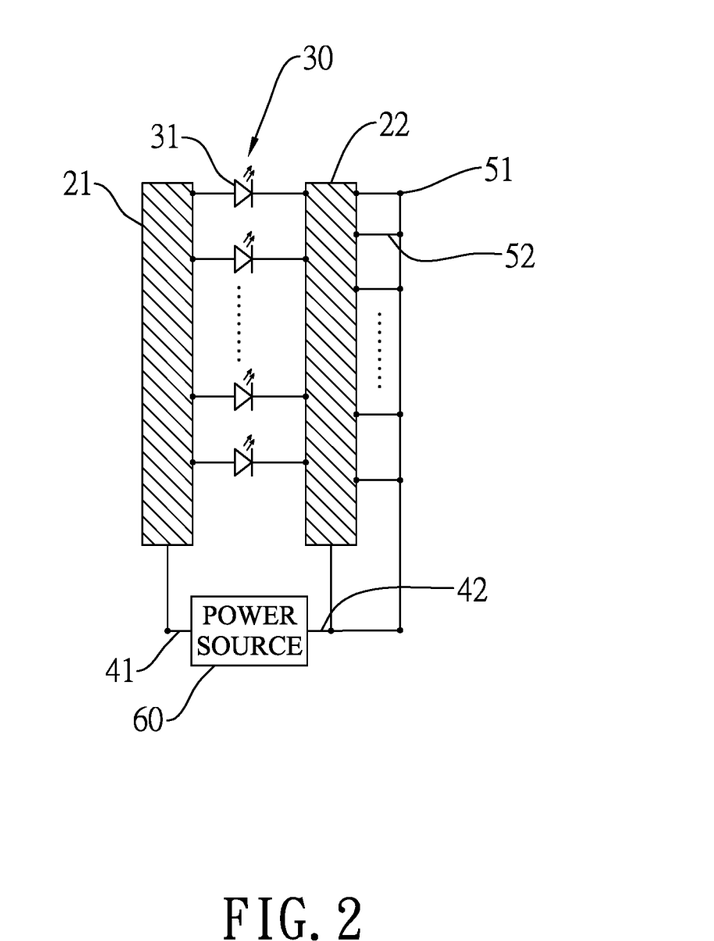
FIG. 2 is a circuit diagram of the uniform luminance LED circuit board in FIG. 1.

With reference to FIGS. 1 and 2, a first embodiment of a uniform luminance light-emitting diode (LED) circuit board in accordance with the present invention includes a first primary trace 21, a second primary trace 22, multiple LED strings 30, a first power trace 41, a second power trace 42, and a first auxiliary trace 51. The first primary trace 21, the second primary trace 22, the multiple LED strings 30, the first power trace 41, the second power trace 42, and the first auxiliary trace 51 are mounted on a substrate 10. The first primary trace 21 and the second primary trace 22 are spaced apart from each other.

The multiple LED strings 30 are mounted between the first primary trace 21 and the second primary trace 22. Two ends of each LED string 30 are electrically connected to the first primary trace 21 and the second primary trace 22 respectively for the multiple LED strings 30 to be parallelly connected between the first primary trace 21 and the second primary trace 22. In the present embodiment, each LED string 30 has an LED 31.

The first power trace 41 and the second power trace 42 are adjacent to two opposite edges of the substrate 10. One end of the first power trace 41 is electrically connected to the first primary trace 21 and one end of the second power trace 42 is electrically connected to the second primary trace 22. The other ends of the first power trace 41 and the second power trace 42 are connected to a power source 60 to supply an operating power from the power source 60 to the multiple LED strings 30 through the first primary trace 21 and the second primary trace 22 for the multiple LED strings 30 to emit light.

Two ends of the first auxiliary trace 51 are electrically connected to the second primary trace 22 and the second power trace 42 respectively. At least one branch trace 52 is mounted between the second primary trace 22 and the first auxiliary trace 51. Two ends of each one of the at least one branch trace 52 are electrically connected to the second primary trace 22 and the first auxiliary trace 51 respectively.

The first auxiliary trace 51 serves to provide an additional path for current to flow through, such that a resistance value between each LED string 30 and the power source 60 can be reduced to lower power consumption. The resistance value between the power source 60 and the most distant one of the multiple LED strings 30 to the power source 60 is highest. Because one end of the first auxiliary trace 51 is adjacent to the most distant LED string 30, the first auxiliary trace 51 can be taken as a current path with lower resistance value for current to flow through to avoid luminance reduction of the multiple LED strings 30 arising from current loss taking place in other current paths with higher resistance values. As each one of the at least one first branch trace 52 is connected between the first auxiliary trace 51 and the second primary trace 22 to serve as an additional current path for current to flow through the at least one first branch trace 52 and corresponding parts of the first auxiliary trace 51 with lower resistance values, unnecessary current consumption due to trace resistance can be reduced and current passing through the multiple LED strings 30 has an identical current value to ensure a same lighting intensity and uniform luminance for the multiple LED strings 30. The number of the at least one first branch trace 52 is proportional to that of the multiple LED strings 30.

The first primary trace 21 and the second primary trace 22 take the form of a planar trace. The trace widths of the first primary trace 21 and the second primary trace 22 are all greater than those of the first power trace 41 and the second power trace 42. A resistance value of a circuit loop associated with each LED string 30 is reduced to control current flowing through the LED string 30, such that the present invention can be applied to LED parallel circuits without requiring any resistor connected in series with the LED string 30, thereby simplifying the structure of the substrate 10 and lowering cost of components.

In the present embodiment, the substrate 10 is rectangular, and the first primary trace 21 and the second primary trace 22 are arranged along a longitudinal direction of the substrate 10 and are spaced apart from each other. The multiple LED strings 30 are also sequentially arranged along the longitudinal direction. The first power trace 41 and the second power trace 42 are adjacent to a lateral direction of the substrate 10. Besides being rectangular, the substrate 10 may be arced for the first primary trace 21, the second primary trace 22 and the multiple LED strings 30 to take the form of a sector or a circle.

Figure 3:
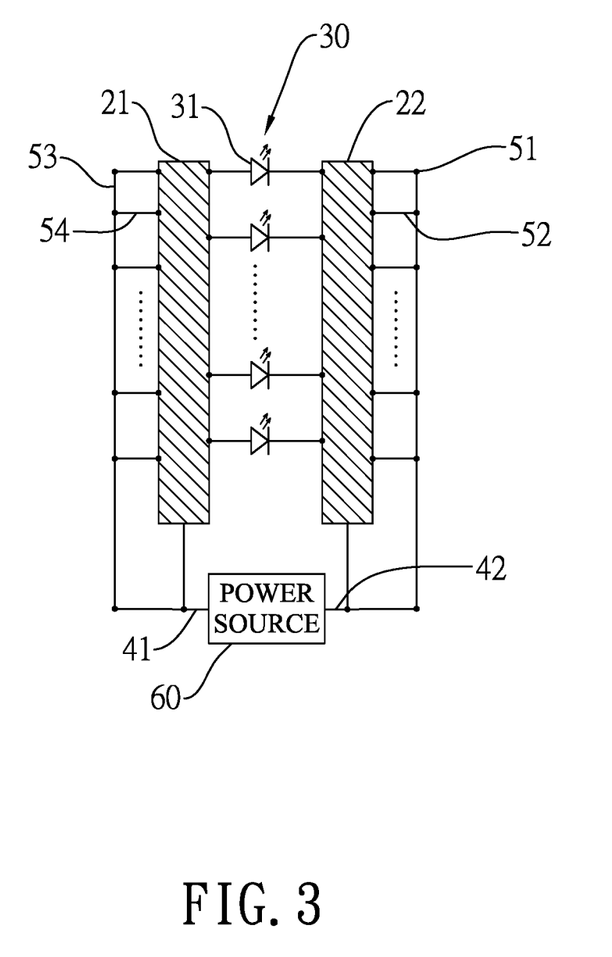
FIG. 3 is a circuit diagram of a second embodiment of a uniform luminance LED circuit board in accordance with the present invention.

With reference to FIG. 3, a second embodiment of a uniform luminance LED circuit board in accordance with the present invention differs from the first embodiment in that the uniform luminance LED circuit board further includes a second auxiliary trace 53 and at least one second branch trace 54. The second auxiliary trace 53 is mounted on the substrate 10 and two ends of the second auxiliary trace 53 are electrically connected to the first primary trace 21 and the first power trace 41. The at least one second branch trace 54 is connected between the second auxiliary trace 53 and the first primary trace 21, and two ends of each one of the at least one second branch trace 54 are electrically connected to the first primary trace 21 and the second auxiliary trace 53 respectively.

The second auxiliary trace 53 serves to provide an additional current path for current to flow through, such that a resistance value between each LED string 30 and the power source 60 can be reduced to lower power consumption. Because the second auxiliary trace 53 is connected between the second auxiliary trace 53 and the first primary trace 21, the second auxiliary trace 53 can be taken as a current path with lower resistance value for current to flow through to avoid luminance reduction of the multiple LED strings 30 arising from current loss taking place in other current paths with higher resistance values. As each one of the at least one second branch trace 54 is connected between the second auxiliary trace 53 and the first primary trace 21 to serve as an additional current path for current to flow through the at least one second branch trace 54 and corresponding parts of the second auxiliary trace 53 with lower resistance values, unnecessary current consumption due to trace resistance can be reduced and current passing through the multiple LED strings 30 has an identical current value to ensure a same lighting intensity and uniform luminance for the multiple LED strings 30. The number of the at least one second branch trace 52 is proportional to that of the multiple LED strings 30.

Figure 4:
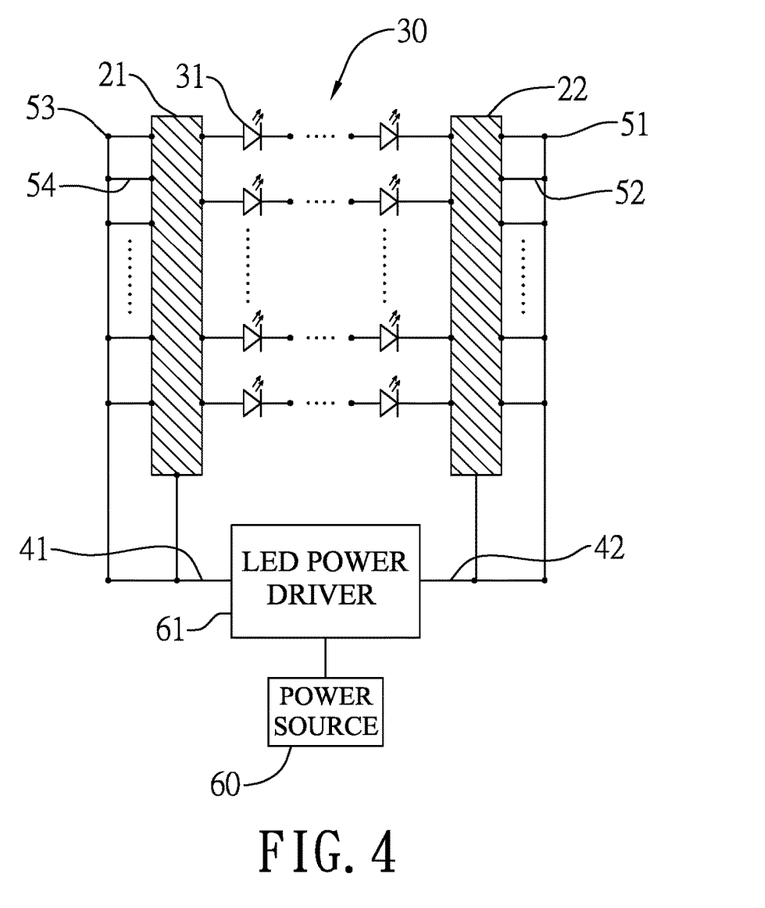
FIG. 4 is a circuit diagram of a third embodiment of a uniform luminance LED circuit board in accordance with the present invention.

With reference to FIG. 4, a third embodiment of a uniform luminance LED circuit board in accordance with the present invention differs from the second embodiment in that each LED string 30 has multiple LEDs 31 connected in series. In the present embodiment, each LED string 30 has M pieces of LEDs 31. By virtue of the first primary trace 21 and the second primary trace 22, N pieces of LED strings are parallelly connected to form an M×N array. Similar to the second embodiment, the first auxiliary trace 51, the second auxiliary trace 53, the at least one first branch trace 52 and the at least one second branch trace 54 in the present embodiment can be also taken to provide additional current paths to lower the resistance values of circuit loops between the multiple LED strings 30 and the power source 60 for current flowing through the multiple LED strings 30 to be the same. Given the circuit board of the present invention, the parallel circuit of the multiple LED strings requires no current compensation module, such that the multiple LED strings can emit light with identical luminance or uniform luminance.

The LEDs 31 in the multiple LED strings 30 of the foregoing embodiments may be single-core LEDs, double-core LEDs or multi-core LEDs.

In sum, the present invention is involved with an LED circuit board capable of generating uniform luminance. The first primary trace 21 and the second primary trace 22 with wider trace widths are used as the major current path with smaller resistance not to suppress current flowing through the multiple LED strings 30, and the first auxiliary trace 51 and the second auxiliary trace 53 with thinner trace widths are used as the additional current paths with lower resistance to reduce the resistance value of circuit loops, such that the resistance values between the LED strings 30 and the power source 60 are not subject to the effect of trace length and the LED strings 30 can stably emit light with uniform luminance. As such, the present invention can emit light with uniform luminance without requiring any series-connected resistor or additional voltage boosting or additional LED power driver with multiple channels, and there is no concern of over-current power passing through the LEDs. Accordingly, a simplified circuit and lower production cost can be ensured.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A uniform luminance light-emitting diode (LED) circuit board, comprising:
    a substrate;
    a first primary trace mounted on the substrate;
    a second primary trace mounted on the substrate and spaced apart from the first primary trace;
    multiple LED strings sequentially mounted on the substrate with two ends of each LED string electrically connected to the first primary trace and the second primary trace respectively and parallelly connected between the first primary trace and the second primary trace;
    a first power trace mounted on the substrate and having two ends, wherein one end of the first power trace is electrically connected to the first primary trace and the other end of the first power trace is adapted to connect to a power source;
    a second power trace mounted on the substrate and having two ends, wherein one end of the second power trace is electrically connected to the second primary trace and the other end of the second power trace is adapted to connect to the power source; and
    a first auxiliary trace mounted on the substrate with two ends of the first auxiliary trace electrically connected to the second primary trace and the second power trace respectively, wherein the end of the first auxiliary trace connected to the second primary trace is adjacent to a most distant one of the multiple LED strings from the power source;
    multiple first branch traces connected between the second primary trace and the first auxiliary trace and are sequentially arranged in a longitudinal direction along the second primary trace, wherein the number of the multiple first branch traces is proportional to a count of the multiple LED strings;
    wherein trace widths of the first primary trace and the second primary trace are wider than trace widths of the first power trace, the second power trace and the first auxiliary trace.

2. The uniform luminance LED circuit board as claimed in claim 1, further comprising a second auxiliary trace mounted on the substrate with two ends of the second auxiliary trace electrically connected to the first primary trace and the first power trace respectively, wherein the trace widths of the first primary trace and the second primary trace are wider than a trace width of the second auxiliary trace.

3. The uniform luminance LED circuit board as claimed in claim 2, wherein multiple second branch traces are connected between the first primary trace and the second auxiliary trace, are sequentially arranged in a direction along the first primary trace, and a count of the multiple second branch traces is proportional to the count of the multiple LED strings.

4. The uniform luminance LED circuit board as claimed in claim 2, wherein each LED string has an LED.

5. The uniform luminance LED circuit board as claimed in claim 4, wherein the LED of each LED string is one of a single-core LED, a double-core LED and a multi-core LED.

6. The uniform luminance LED circuit board as claimed in claim 4, wherein the substrate is rectangular, the first primary trace and the second primary trace are arranged along a longitudinal direction of the substrate, and the multiple LED strings are sequentially arranged along the longitudinal direction.

7. The uniform luminance LED circuit board as claimed in claim 2, wherein each LED string has multiple LEDs connected in series.

8. The uniform luminance LED circuit board as claimed in claim 7, wherein the multiple LEDs of each LED string are one of single-core LEDs, double-core LEDs and multi-core LEDs.

9. The uniform luminance LED circuit board as claimed in claim 7, wherein the substrate is rectangular, the first primary trace and the second primary trace are arranged along a longitudinal direction of the substrate, and the multiple LED strings are sequentially arranged along the longitudinal direction.

10. The uniform luminance LED circuit board as claimed in claim 7, wherein the substrate is arced for the first primary trace, the second primary trace and the multiple LED strings to take the form of a sector or a circle.

11. The uniform luminance LED circuit board as claimed in claim 1, wherein each LED string has an LED.

12. The uniform luminance LED circuit board as claimed in claim 11, wherein the LED of each LED string is one of a single-core LED, a double-core LED and a multi-core LED.

13. The uniform luminance LED circuit board as claimed in claim 11, wherein the substrate is rectangular, the first primary trace and the second primary trace are arranged along a longitudinal direction of the substrate, and the multiple LED strings are sequentially arranged along the longitudinal direction.

14. The uniform luminance LED circuit board as claimed in claim 1, wherein each LED string has multiple LEDs connected in series.

15. The uniform luminance LED circuit board as claimed in claim 14, wherein the multiple LEDs of each LED string are one of single-core LEDs, double-core LEDs and multi-core LEDs.

16. The uniform luminance LED circuit board as claimed in claim 14, wherein the substrate is rectangular, the first primary trace and the second primary trace are arranged along a longitudinal direction of the substrate, and the multiple LED strings are sequentially arranged along the longitudinal direction.

* * * * *